(12) United States Patent
Iwata

(10) Patent No.: US 8,648,944 B2
(45) Date of Patent: Feb. 11, 2014

(54) SOLID-STATE IMAGE SENSOR AND CAMERA HAVING IMPURITY DIFFUSION REGION

(75) Inventor: Junji Iwata, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 155 days.

(21) Appl. No.: 12/949,335

(22) Filed: Nov. 18, 2010

(65) Prior Publication Data

US 2011/0141328 A1    Jun. 16, 2011

(30) Foreign Application Priority Data

Dec. 11, 2009    (JP) ................................. 2009-282222

(51) Int. Cl.
 *H04N 3/14*      (2006.01)
 *H04N 5/335*     (2011.01)
 *H01L 31/062*    (2012.01)
 *H01L 31/113*    (2006.01)
 *H01L 21/70*     (2006.01)

(52) U.S. Cl.
 USPC ........... 348/294; 348/296; 348/311; 257/292; 257/338

(58) Field of Classification Search
 USPC .................. 348/294, 311, 296; 257/338, 292
 See application file for complete search history.

(56) References Cited

U.S. PATENT DOCUMENTS

| | | | |
|---|---|---|---|
| 2001/0010553 A1* | 8/2001 | Tanaka et al. ................ | 348/311 |
| 2002/0075720 A1* | 6/2002 | Akita ............................ | 365/149 |
| 2004/0169127 A1* | 9/2004 | Ohkawa ....................... | 250/214.1 |
| 2006/0192250 A1* | 8/2006 | Lee .............................. | 257/338 |
| 2006/0219867 A1 | 10/2006 | Yamaguchi et al. ......... | 250/208.1 |
| 2007/0235781 A1 | 10/2007 | Fujita et al. ................. | 257/292 |
| 2008/0121979 A1* | 5/2008 | Nishikawa et al. .......... | 257/321 |

FOREIGN PATENT DOCUMENTS

| | | |
|---|---|---|
| JP | 2003-258232 A | 9/2003 |
| JP | 2006-024907 A | 1/2006 |
| JP | 2006-286933 A | 10/2006 |

* cited by examiner

*Primary Examiner* — Joel Fosselman
(74) *Attorney, Agent, or Firm* — Fitzpatrick, Cella, Harper & Scinto

(57) ABSTRACT

A solid-state image sensor including a plurality of pixels formed on a semiconductor substrate, each pixel comprising a photoelectric conversion element including a charge accumulation region of a first conductivity type, a floating diffusion of the first conductivity type, and a transfer transistor which transfers charge in the charge accumulation region to the floating diffusion, comprises an element isolation region made of an insulator and arranged to isolate adjacent pixels from each other, and an impurity diffusion region of a second conductivity type arranged inside the semiconductor substrate to isolate adjacent pixels from each other, wherein a peak position of an impurity concentration of the impurity diffusion region of one pixel is disposed within a width of the floating diffusion, of the one pixel, along a straight line passing through the photoelectric conversion element, a gate electrode of the transfer transistor, and the floating diffusion which are of the one pixel.

7 Claims, 9 Drawing Sheets

CONDITION EXAMPLE
FOR FORMING REGION 103
B, 1.8MeV, 1.7×10¹¹, tilt=0°

CONDITION EXAMPLE
FOR FORMING REGION 104
B, 750keV, 3.5×10¹¹, tilt=0°

CONDITION EXAMPLE
FOR FORMING REGION 105
B, 450keV, 1×10¹², tilt=0°

SOLID-STATE IMAGE SENSOR AND CAMERA HAVING IMPURITY DIFFUSION REGION

BACKGROUND OF THE INVENTION

1. Field of the Invention

The present invention relates to a solid-state image sensor having a plurality of pixels and a camera including the sensor.

2. Description of the Related Art

In a solid-state image sensor having a plurality of pixels, part of the charge generated in a given pixel by photoelectric conversion sometimes mixes in an adjacent pixel. This may affect a signal from the adjacent pixel. Many color solid-state image sensors, in particular, use a Bayer arrangement as a pixel arrangement. In a Bayer arrangement, adjacent pixels output signals with different colors. In color solid-state image sensors, the phenomenon in which charge leaks out to adjacent pixels is called mixture of colors. There is known a structure in which, in order to reduce the mixture of colors, an impurity region serving as a potential barrier for signal charge is formed under an element isolation region located at the boundary between adjacent pixels (Japanese Patent Laid-Open No. 2003-258232).

In a CMOS solid-state image sensor in which each pixel has a floating diffusion, as a given pixel shrinks, the width of an element isolation region made of an insulator to isolate adjacent pixels from each other can decrease. With a decrease in the width of an element isolation region, the width of an impurity region forming a potential barrier under the element isolation region decreases, resulting in a degradation in preventive effect for mixture of colors.

Increasing the width of an impurity region to more than that of an element isolation region in order to form a sufficient potential barrier will suppress the depletion layer of a photodiode adjacent to the element isolation region and decrease the effective area. This leads to a decrease in saturated output. In addition, improving the effect of a potential barrier by increasing the impurity concentration without increasing the width of the impurity region will spread the impurity in the lateral direction and prevent the spread of the depletion layer of an adjacent photodiode. This leads to a decrease in effective area.

SUMMARY OF THE INVENTION

The present invention provides a solid-state image sensor having a structure advantageous in decreasing the width of an element isolation region.

One of the aspects of the present invention provides a solid-state image sensor including a plurality of pixels formed on a semiconductor substrate, each pixel comprising a photoelectric conversion element including a charge accumulation region of a first conductivity type, a floating diffusion of the first conductivity type, and a transfer transistor which transfers charge accumulated in the charge accumulation region to the floating diffusion, the solid-state image sensor comprising an element isolation region which is made of an insulator and arranged to isolate adjacent pixels from each other, and an impurity diffusion region of a second conductivity type arranged inside the semiconductor substrate to isolate adjacent pixels from each other, wherein a peak position of an impurity concentration of the impurity diffusion region of one pixel is disposed within a width of the floating diffusion, of the one pixel, along a straight line passing through the photoelectric conversion element, a gate electrode of the transfer transistor, and the floating diffusion which are of the one pixel.

Further features of the present invention will become apparent from the following description of exemplary embodiments with reference to the attached drawings.

DESCRIPTION OF THE EMBODIMENTS

Figure 7:
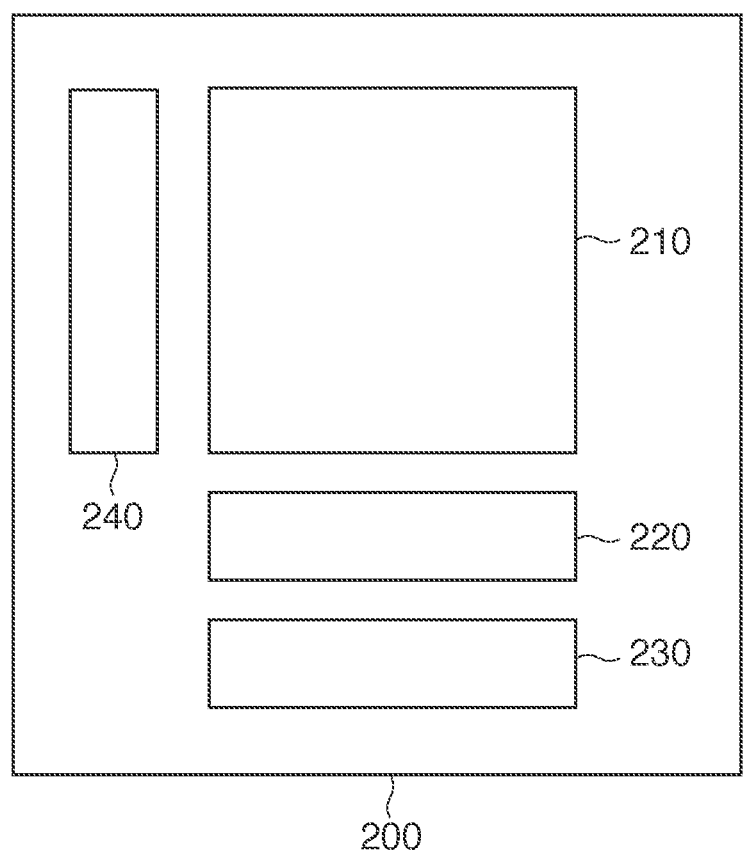
FIG. 7 is a block diagram showing the arrangement of a solid-state image sensor according to an embodiment of the present invention.

The arrangement of a solid-state image sensor 200 according to an embodiment of the present invention will be described with reference to FIG. 7. The solid-state image sensor 200 is formed on a semiconductor substrate and can be called a MOS image sensor, CMOS sensor, or the like. The solid-state image sensor 200 includes a pixel array 210 having pixels arranged two-dimensionally so as to form a plurality of rows and a plurality of columns. The solid-state image sensor 200 can also include a row selecting circuit 240 to select a row in the pixel array 210, a column selecting circuit 230 to select a column in the pixel array 210, and a readout circuit 220 to read out signals from a column in the pixel array 210 which is selected by the column selecting circuit 230. The row selecting circuit 240 and the column selecting circuit 230 can include shift registers but can be respectively configured to make random access to rows and columns.

Figure 8A:
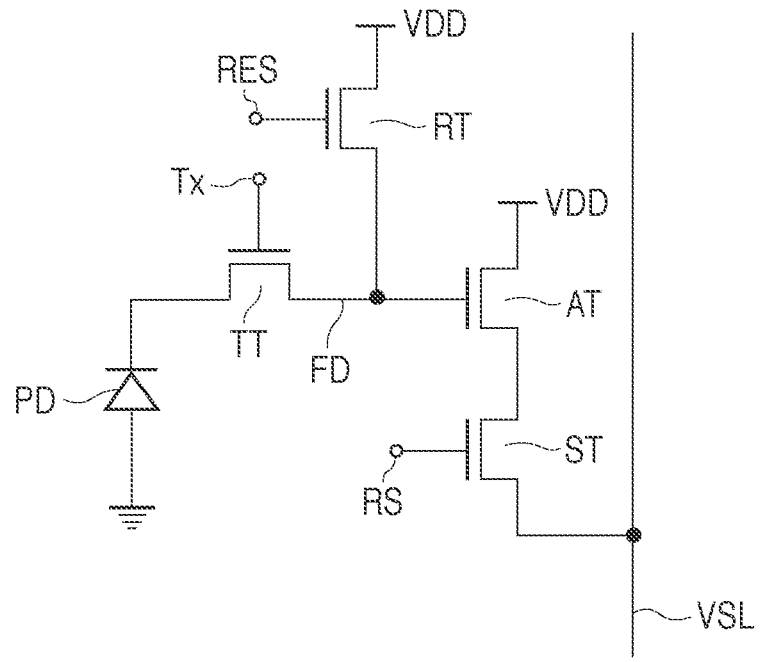
FIGS. 8A and 8B are circuit diagrams each showing an example of the arrangement of each pixel constituting a pixel array.
Figure 8B:
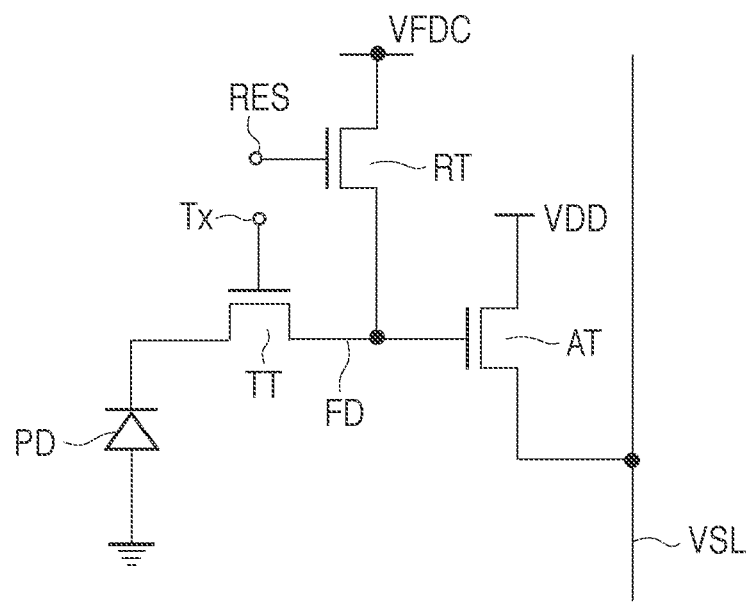
Figure 9A:
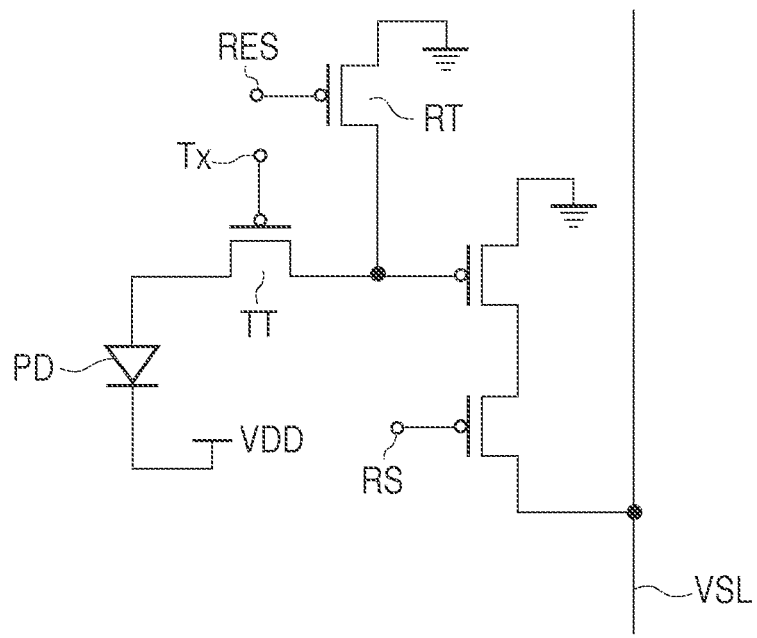
FIGS. 9A and 9B are circuit diagrams each showing an example of the arrangement of each pixel constituting a pixel array.
Figure 9B:
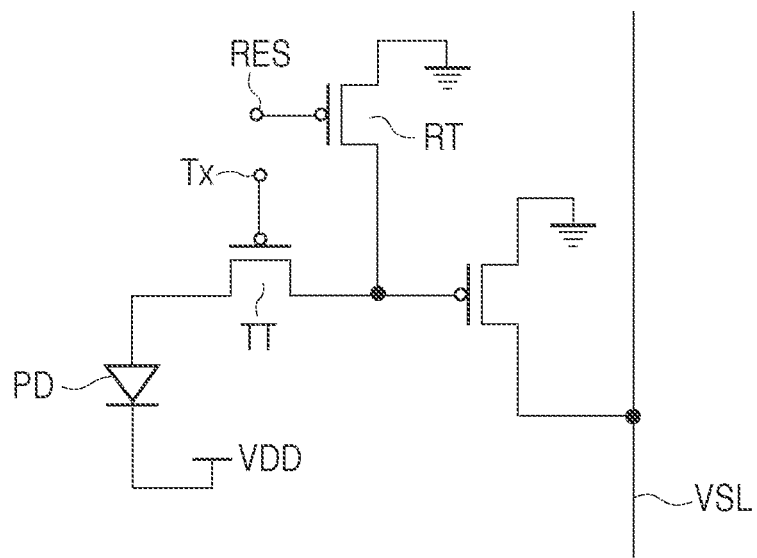

FIGS. 8A and 8B and FIGS. 9A and 9B are circuit diagrams each showing an example of the arrangement of each pixel constituting the pixel array 210. Each pixel is formed on a semiconductor substrate. FIGS. 8A and 8B respectively show examples of a pixel configured to read out an electron and a hole which can be generated by photoelectric conversion as a signal. FIGS. 9A and 9B respectively show examples of a pixel configured to read out a hole of an electron and a hole which can be generated by photoelectric conversion as a signal. FIGS. 8A and 9A respectively show examples of a pixel having a selecting transistor ST for row selection. FIGS. 8B and 9B respectively show examples of a pixel having an arrangement to select a row by controlling a reset voltage for a floating diffusion FD.

According to the arrangement example shown in FIG. 8A, each pixel includes a photodiode PD as a photoelectric conversion element, a transfer transistor TT, an amplifier transistor AT, a reset transistor RT, and the selecting transistor ST. The transfer transistor TT, the amplifier transistor AT, the reset transistor RT, and the selecting transistor ST are NMOS transistors. In this arrangement example, the photodiode PD has an anode connected to the ground and a cathode connected to the transfer transistor TT. The photodiode PD has a charge accumulation region of the first conductivity type (in this case, the n-type). The floating diffusion FD is reset to a predetermined voltage (for example, a power supply voltage VDD) by applying a reset pulse RES to the gate of the reset transistor RT. The charge (in this arrangement example, electrons) accumulated in the charge accumulation region is transferred to the floating diffusion FD by applying a transfer pulse Tx to the gate of the transfer transistor TT. The voltage of the floating diffusion FD changes in accordance with the amount of charge transferred. When the selecting transistor ST is turned on upon application of a selecting pulse RS to the gate of the selecting transistor ST, the amplifier transistor AT amplifies the voltage of the floating diffusion FD and outputs the amplified voltage to a vertical signal line VSL. The row selecting circuit 240 generates the transfer pulse Tx, the reset pulse RES, and the selecting pulse RS.

The arrangement example shown in FIG. 8B is equivalent to that shown in FIG. 8A except that the row selecting transistor ST is omitted. In the arrangement example shown in FIG. 8B, when the reset pulse RES is applied to the reset transistor RT while a voltage VFDC of the drain of the reset transistor RT is set to the first voltage, the pixel is set in the selected state. When the reset pulse RES is applied to the reset transistor RT while the voltage VFDC of the drain of the reset transistor RT is set to the second voltage, the pixel is set in the unselected state.

In the arrangement example shown in FIG. 9A, the transfer transistor TT, the amplifier transistor AT, the reset transistor RT, and the selecting transistor ST are PMOS transistors. In this arrangement example, the photodiode PD has a cathode to which a predetermined positive voltage (for example, the power supply voltage VDD) is applied, and an anode which is connected to the transfer transistor TT. The photodiode PD has a charge accumulation region of the first conductivity type (in this case, the p-type). When the reset pulse RES is applied to the gate of the reset transistor RT, the floating diffusion FD is reset to a predetermined voltage (for example, the ground voltage). When the transfer pulse Tx is applied to the gate of the transfer transistor TT, the charge (in this arrangement example, holes) accumulated in the charge accumulation region is transferred to the floating diffusion FD. Other operation is the same as the operation of the arrangement example shown in FIG. 8A. The arrangement example shown in FIG. 9B is equivalent to that shown in FIG. 9A except that the row selecting transistor ST is omitted. The operation is the same as that of the arrangement example shown in FIG. 8B.

As described above, each pixel includes the photodiode PD as a photoelectric conversion element having a charge accumulation region of a certain conductivity type, the floating diffusion FD of the same conductivity type as that of the photodiode PD, and the transfer transistor TT to transfer the charge generated by the photodiode PD to the floating diffusion FD. Note that the present invention is not limited to the pixels exemplified in FIGS. 8A and 8B and FIGS. 9A and 9B, and can be applied to various types of pixels.

Figure 1:
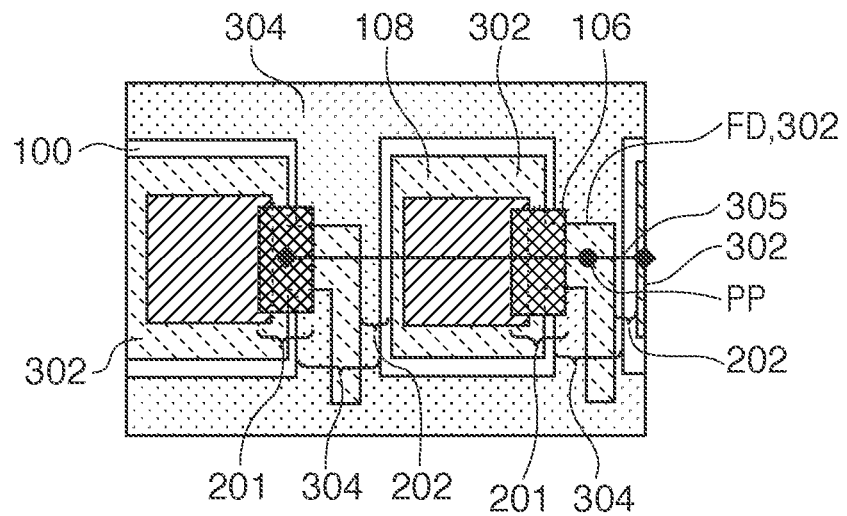
FIG. 1 is a layout view showing the placement of the photodiodes, transfer transistors, and floating diffusions of two pixels in a solid-state image sensor according to an embodiment.
Figure 2:
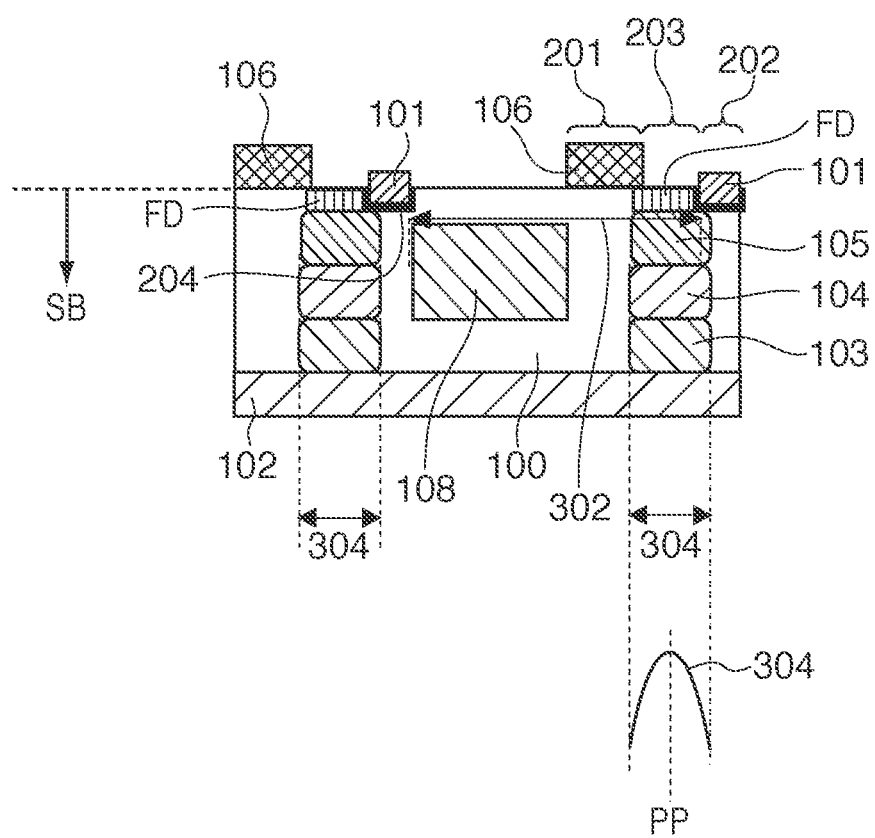
FIG. 2 is a sectional view showing the structure of a pixel in a solid-state image sensor according to the first embodiment.

The arrangement of a pixel according to the first embodiment of the present invention will be described with reference to FIGS. 1 to 4C. The first embodiment uses the arrangements shown in FIGS. 8A and 8B which are configured to read out electrons as signal charge. FIG. 1 is a layout view showing the placement of the photodiodes, transfer transistors, and floating diffusions of two pixels in the solid-state image 200. FIG. 2 is a sectional view obtained by cutting a semiconductor substrate SB along a straight line 305 in FIG. 1. For the sake of simplicity, the following description is based on the assumption that the first and second conductivity types are the p-type and the n-type, respectively. However, the first and second conductivity types may be the p-type and the n-type, respectively. The photodiode PD can include a charge accumulation region 108 of the first conductivity type (n-type), an impurity region 100 of the first conductivity type which surrounds the charge accumulation region 108, and a buried layer 102 of the second conductivity type (p-type) placed below the charge accumulation region 108 through the impurity region 100. The solid-state image sensor 200 includes an element isolation region 101 made of an insulator (silicon oxide) which is placed on the semiconductor substrate SB to isolate adjacent pixels from each other and an active region 302 surrounded by the element isolation region 101. The solid-state image sensor 200 includes an impurity diffusion region 304 of the second conductivity type (p-type) which is placed inside the semiconductor substrate SB so as to isolate the adjacent pixels from each other. The impurity diffusion region 304 forms a potential barrier to isolate the adjacent pixels from each other. A gate electrode 106 of the transfer transistor TT is formed on a gate oxide film (not shown) on the surface of the semiconductor substrate SB.

Consider the straight line 305 passing through the photodiode PD, the gate electrode 106 of the transfer transistor TT, and the floating diffusion FD which are of one pixel. A peak position PP of an impurity concentration 50 of at least one region in the impurity diffusion region 304 of the one pixel is disposed within the width of the floating diffusion FD, of the one pixel, along the straight line 305. An arrangement of the one pixel indicates an arrangement included in the active region 302. Referring to FIGS. 1 and 2, reference numeral 201 denotes the gate length of the gate electrode 106 of the transfer transistor TT; 202, the width of the element isolation region 101; and 203, the interval between the extension of the element isolation region 101 and the extension of the gate electrode 106 of the transfer transistor TT. The impurity diffusion region 304 of the second conductivity type has a structure in which a plurality of regions (impurity diffusion regions) 103, 104, and 105 having different depths are stacked on each other. The region 103, of the plurality of regions 103, 104, and 105, which is located at the deepest position contacts the buried layer 102. This arrangement forms a potential barrier connected to the buried layer 102 to reduce mixture of colors.

This embodiment can make the center of the charge accumulation region 108 closer to the intermediate position between the two impurity diffusion regions 304 located on the two sides of the charge accumulation region 108 than the arrangement in which an impurity diffusion region for the formation of a potential barrier is placed immediately below an element isolation region, as exemplified by FIG. 2. According to the first embodiment, the impurity diffusion regions 304 which are adjacent to each other through the center of the charge accumulation region 108 do not easily suppress the depletion layer of the charge accumulation region 108. This can therefore increase the charge number in the charge accumulation region 108. This makes it possible to improve the saturated output of the solid-state image sensor 200. Such effects are advantageous, in particular, when the pixel dimensions are decreased.

A method of manufacturing the solid-state image sensor 200 will be described with reference to FIGS. 3A to 3D and FIGS. 4A to 4C. In the step shown in FIG. 3A, the element isolation region 101, an impurity diffusion region 204 of the second conductivity type (p-type) covering the bottom and side portions of the element isolation region 101, and the buried layer 102 of the second conductivity type are formed on the semiconductor substrate SB having the impurity region 100 of the first conductivity type.

Figure 3A:
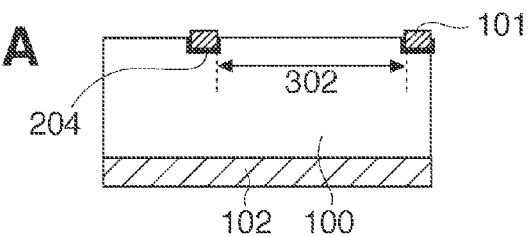
FIGS. 3A to 3D are sectional views showing a method of manufacturing a solid-state image sensor according to the first embodiment.
Figure 3B:
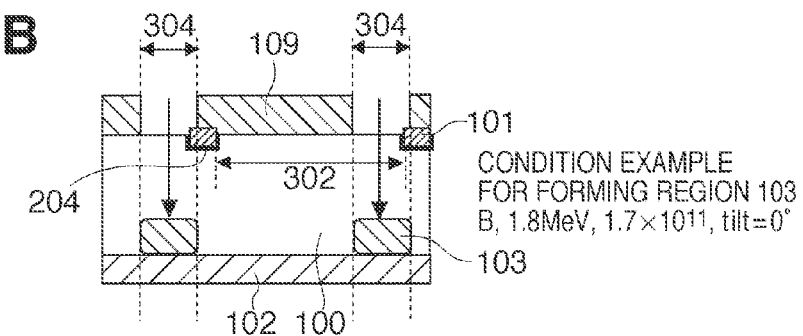

In the step shown in FIG. 3B, a resist pattern 109 is formed on the semiconductor substrate SB, and ions of the second conductivity type are implanted into the semiconductor substrate SB through the opening portion of the resist pattern 109. This forms the region 103 which is part of the impurity diffusion region 304 of the second conductivity type. Ion implantation is performed at tilt angle (a tilt angle relative to a normal to the semiconductor substrate)=0°. In addition, for example, ion implantation can be performed under the following conditions: ion species=boron, implantation energy=1.8 MeV, and dose=$1.7 \times 10^{11}$ (cm$^{-2}$).

Figure 3C:
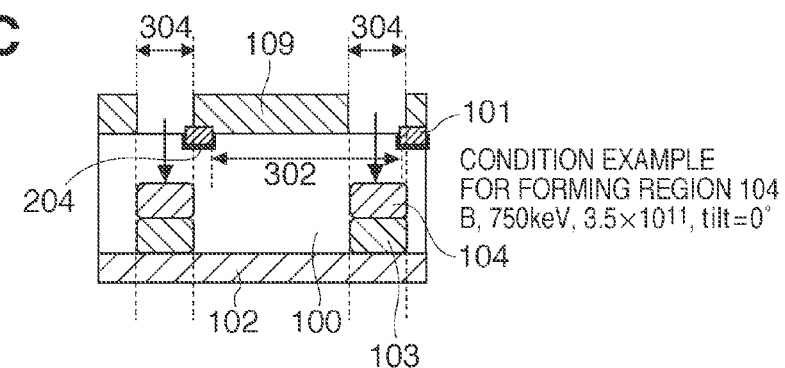
Figure 3D:
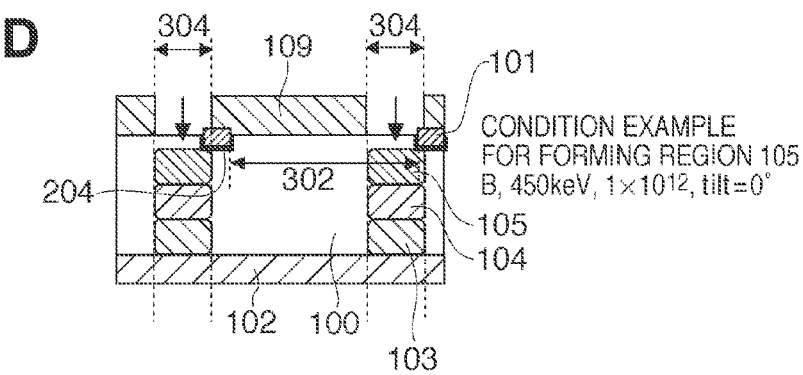

In the step shown in FIG. 3C, the region 104 forming part of the impurity diffusion region 304 of the second conductivity type is formed by implanting ions of the second conductivity type into the semiconductor substrate SB through the opening portion of the resist pattern 109. Ion implantation is performed at tilt angle=0°. In addition, for example, ion implantation can be performed under the following conditions: ion species=boron, implantation energy=750 keV, and dose=$3.5 \times 10^{11}$ (cm$^{-2}$). In the step shown in FIG. 3D, the region 105 forming part of the impurity diffusion region 304 of the second conductivity type is formed by implanting ions of the second conductivity type into the semiconductor substrate SB through the opening portion of the resist pattern 109. Ion implantation is performed at tilt angle=0°. In addition, for example, ion implantation can be performed under the following conditions: ion species=boron, implantation energy=450 keV, and dose=$1.0 \times 10^{12}$ (cm$^{-2}$). When the above ion implantation is complete, the resist pattern 109 is removed.

Figure 4A:
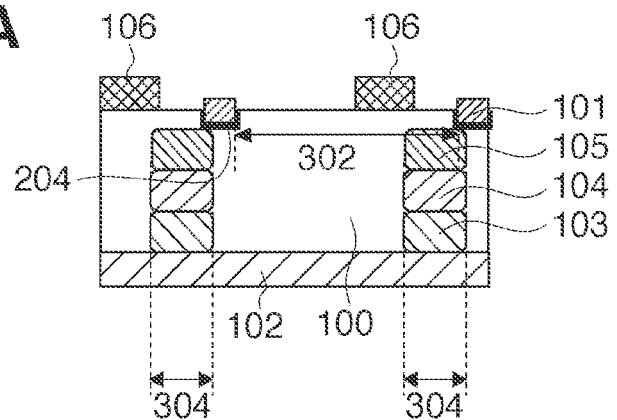
FIGS. 4A to 4C are sectional views showing a method of manufacturing a solid-state image sensor according to the first embodiment.

In the step shown in FIG. 4A, after a gate insulating film (not shown) is formed, the gate electrode 106 of the transfer transistor TT is formed. In this step, typically, the gate insulating films and gate electrodes of other transistors (for example, the reset transistor RT and the selecting transistor ST) are also formed.

Figure 4B:
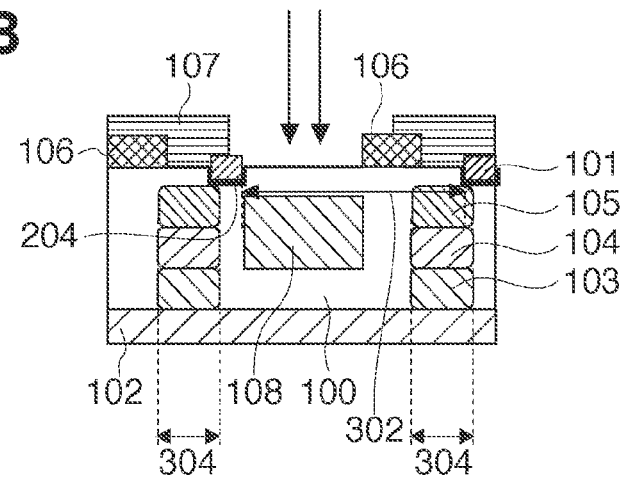

In the step shown in FIG. 4B, a resist pattern 107 is formed on the semiconductor substrate SB, and the charge accumulation region 108 of the first conductivity type is formed by implanting ions of the first conductivity type into the semiconductor substrate SB through the opening portion of the resist pattern 107. Thereafter, the resist pattern 107 is removed.

Figure 4C:
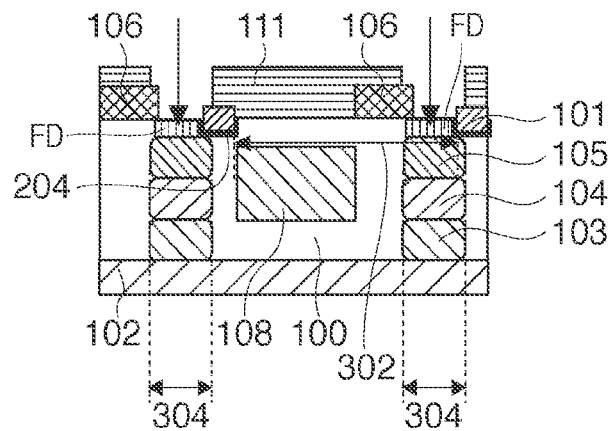
Figure 5:
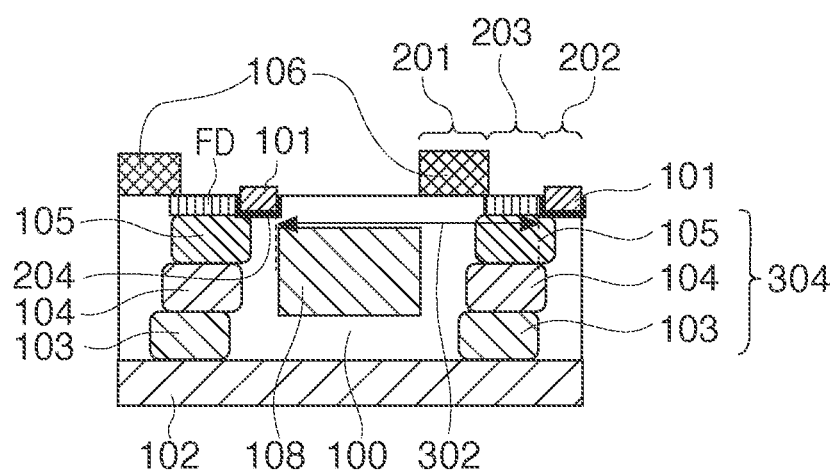
FIG. 5 is a sectional view showing the structure of a pixel in a solid-state image sensor according to the second embodiment.

In the step shown in FIG. 4C, a resist pattern 111 is formed on the semiconductor substrate SB, and the floating diffusion FD of the first conductivity type is formed by implanting ions of the first conductivity type into the semiconductor substrate SB through the opening portion of the resist pattern 111. In this step, typically, the sources and drains of other transistors of the first conductivity type (for example, the reset transistor RT and the selecting transistor ST) are also formed. Thereafter, the resist pattern 111 is removed to obtain the structure shown in FIG. 2.

The second embodiment of the present invention will be described below with reference to FIGS. 5 and 6A to 6C. The second embodiment differs from the first embodiment in the structure of an impurity diffusion region 304 of the second conductivity type (p-type) placed in a semiconductor substrate SB so as to isolate adjacent pixels from each other. Matters that are not particularly referred to as the second embodiment can follow the first embodiment. In the second embodiment, when considering an impurity diffusion region 304 (a plurality of regions 103 to 105) and a charge accumulation region 108 within an active region 302 surrounded by an element isolation region 101, the plurality of regions 103 to 105 located at deeper positions are closer to the charge accumulation region 108. This structure will be referred to as a shifted structure hereinafter. Of the plurality of regions 103, 104, and 105, at least the region 103 located at the deepest position can be formed by implanting ions into the semiconductor substrate at an angle tilted relative to the normal to the semiconductor substrate SB. For example, of the plurality of regions 103, 104, and 105, the regions except for the region 105 located at the shallowest position (on the surface side of the semiconductor substrate SB), that is, the regions 104 and 103, can be formed by implanting ions into the semiconductor substrate SB at angles tilted relative to the normal to the semiconductor substrate SB.

The width of the element isolation region 101 is typically smaller than the gate length of a gate electrode 106 of the transfer transistor TT. The shifted structure of the plurality of regions 103, 104, and 105 is effective in bringing the center of the charge accumulation region 108 closer to the intermediate position between the impurity diffusion regions 304 which are adjacent to each other through the charge accumulation region 108. This can prevent the deep impurity diffusion regions formed by ion implantation with high accelerating energy from suppressing the effective area of a photodiode PD even when the impurity diffusion regions diffused in the lateral direction. It is therefore possible to improve saturated output and prevent mixture of colors.

Figure 6A:
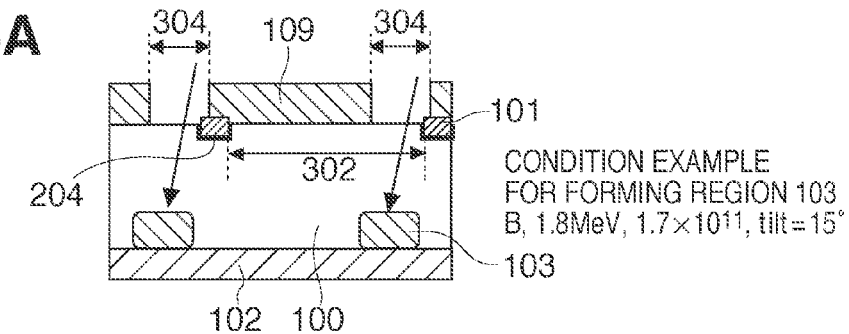
FIGS. 6A to 6C are sectional views showing a method of manufacturing a solid-state image sensor according to the first embodiment.

In the step shown in FIG. 6A, the element isolation region 101, an impurity diffusion region 204 of the second conductivity type (p-type) covering the bottom and side portions of the element isolation region 101, and a buried layer 102 of the second conductivity type are formed on the semiconductor substrate SB having an impurity region 100 of the first conductivity type. In addition, a resist pattern 109 is formed on the semiconductor substrate SB, and the region 103 forming part of the impurity diffusion region 304 of the second conductivity type is formed by implanting ions of the second conductivity type into the semiconductor substrate SB through the opening portion of the resist pattern 109. Ion implantation is performed at tilt angle (a tilt angle relative to a normal to the semiconductor substrate)=15°. In addition, for example, ion implantation can be performed under the following conditions: ion species=boron, implantation energy=1.8 MeV, and dose=$1.7 \times 10^{11}$ (cm$^{-2}$).

Figure 6B:
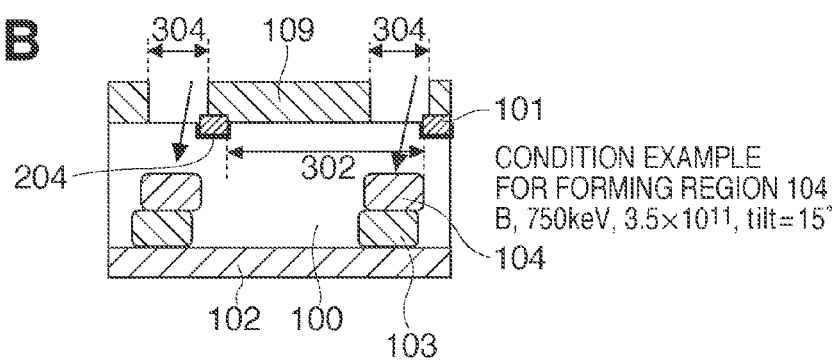
Figure 6C:
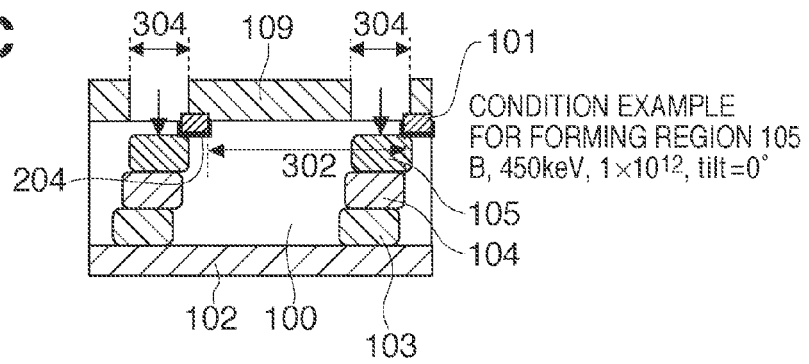

In the step shown in FIG. 6B, the region 104 forming part of the impurity diffusion region 304 of the second conductivity type is formed by implanting ions of the second conductivity type into the semiconductor substrate SB through the opening portion of the resist pattern 109. Ion implantation is performed at tilt angle=15°. In addition, for example, ion implantation can be performed under the following conditions: ion species=boron, implantation energy=750 keV, and dose=$3.5 \times 10^{11}$ (cm$^{-2}$). In the step shown in FIG. 6C, the region 105 forming part of the impurity diffusion region 304 of the second conductivity type is formed by implanting ions of the second conductivity type into the semiconductor substrate SB through the opening portion of the resist pattern 109. Ion implantation is performed at tilt angle=0°. In addition, for example, ion implantation can be performed under the following conditions: ion species=boron, implantation energy=450 keV, and dose=$1.0 \times 10^{12}$ (cm$^{-2}$). When the above ion implantation is complete, the resist pattern 109 is removed. It is possible to change the tilt angles of the regions 103, 104, and 105 of the impurity diffusion region 304 in accordance with the required device structure.

Figure 10:
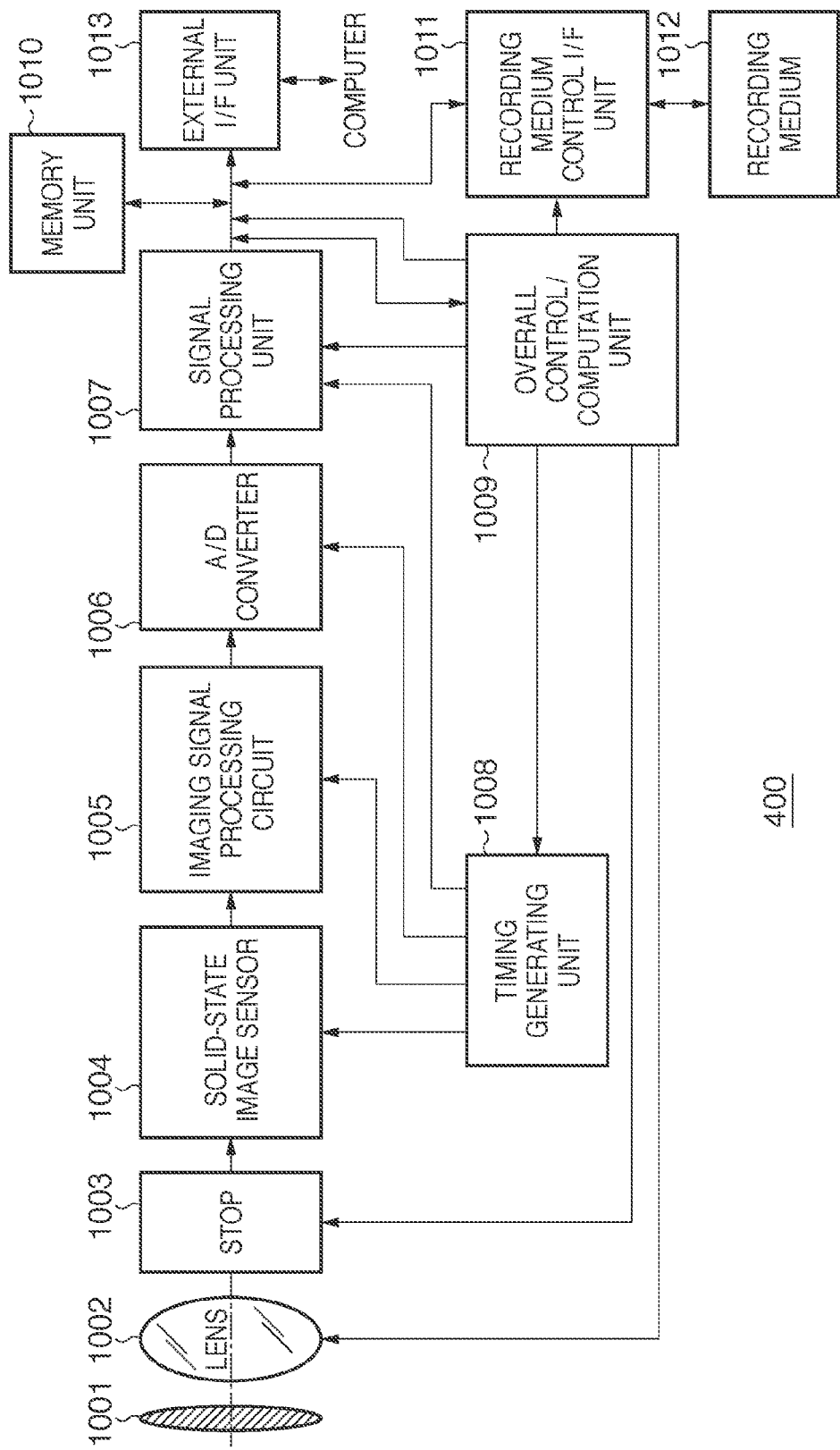
FIG. 10 is a block diagram showing the schematic arrangement of a camera according to an embodiment of the present invention.

FIG. 10 is a block diagram showing the schematic arrangement of a camera according to an embodiment of the present invention. Note that the concept of the camera includes not only an apparatus mainly designed to perform imaging but also an apparatus including an imaging function as an auxiliary function (for example, a personal computer or a portable terminal). A camera 400 includes a solid-state image sensor 1004 typified by the solid-state image sensor 200 described above. A lens 1002 forms an optical image of an object on the imaging plane of the solid-state image sensor 1004. A barrier 1001 serving both as a protecting function for the lens 1002 and a main switch can be provided outside the lens 1002. The lens 1002 can be provided with a stop 1003 to adjust the amount of light emerging from the lens 1002. An imaging signal processing circuit 1005 performs processing such as correction and clamping for the imaging signal output from a solid-state image sensor 1004. An A/D converter 1006 analog/digital-converts the imaging signal output from the imaging signal processing circuit 1005. A signal processing unit 1007 performs signal processing such as correction and data compression for the image data output from the A/D converter 1006. The solid-state image sensor 1004, the imaging signal processing circuit 1005, the A/D converter 1006, and the signal processing unit 1007 operate in accordance with the timing signals generated by a timing generating unit 1008.

The blocks 1005 to 1008 may be formed on the same chip as that of the solid-state image sensor 1004. An overall control/computation unit 1009 controls each block of the camera 400. The camera 400 includes a memory unit 1010 to temporarily store image data and a recording medium control interface unit 1011 to record or read out an image on or from a recording medium. A recording medium 1012 includes a semiconductor memory, and is detachable. The camera 400 may include an external interface (I/F) unit 1013 to communicate with an external computer and the like.

The operation of the camera 400 shown in FIG. 10 will be described next. As the barrier 1001 opens, the main power supply, the power supply for the control system, and the power supply for the imaging system circuit such as the A/D converter 1006 are sequentially turned on. Thereafter, to control an exposure amount, the overall control/computation unit 1009 opens the stop 1003. The signal output from the solid-state image sensor 1004 passes through the imaging signal processing circuit 1005 and is supplied to the A/D converter 1006. The A/D converter 1006 A/D-converts the signal and outputs it to the signal processing unit 1007. The signal processing unit 1007 processes the data and supplies it to the overall control/computation unit 1009. The overall control/computation unit 1009 performs computation to decide an exposure amount. The overall control/computation unit 1009 controls the stop based on the decided exposure amount.

The overall control/computation unit 1009 extracts a high-frequency component from the signal output from the solid-state image sensor 1004 and processed by the signal processing unit 1007, and computes the distance to the object based on the high-frequency component. The overall control/computation unit 1009 then drives the lens 1002 to determine whether an in-focus state is obtained. Upon determining that an in-focus state is not obtained, the overall control/computation unit 1009 drives the lens 1002 again to computer the distance.

After an in-focus state is confirmed, real exposure starts. When the exposure is complete, the imaging signal processing circuit 1005 performs correction and the like for the imaging signal output from the solid-state image sensor 1004. The A/D converter 1006 A/D-converts the signal. The signal processing unit 1007 processes the signal. The overall control/computation unit 1009 accumulates the image data processed by the signal processing unit 1007 in the memory unit 1010.

The image data accumulated in the memory unit 1010 are recorded on the recording medium 1012 via the recording medium control I/F unit under the control of the overall control/computation unit 1009. The image data can be supplied to the computer and the like via the external I/F unit 1013.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-282222, filed Dec. 11, 2009, which is hereby incorporated by reference herein in its entirety.

What is claimed is:

1. A solid-state image sensor, comprising:
    a semiconductor substrate;
    first and second pixels formed on the semiconductor substrate, each of the first and second pixels including a photoelectric conversion element having a charge accumulation region of a first conductivity type, a floating diffusion region of the first conductivity type, and a transfer transistor which transfers charge accumulated in the charge accumulation region to the floating diffusion region;
    an insulator made of dielectric material and arranged at a position between the floating diffusion region of the first pixel and the charge accumulation region of the second pixel; and
    an impurity diffusion region of a second conductivity type arranged at a position inside the semiconductor substrate and below the floating diffusion region of the first pixel and a part of the insulator,
    wherein an impurity concentration profile, along a direction parallel to a surface of the semiconductor substrate, of the impurity diffusion region has a peak at a position below the floating diffusion region of the first pixel.

2. The sensor according to claim 1, wherein the impurity diffusion region includes a plurality of regions which are arranged at positions of different depths.

3. The sensor according to claim 2, wherein in an active region surrounded by the insulator and including the charge accumulation region, a region of the plurality of regions which is located at a deeper position is closer to the charge accumulation region.

4. The sensor according to claim 2, wherein at least a region of the plurality of regions which is located at a deepest position is formed by implanting ions into the semiconductor substrate at an angle tilted relative to a normal to the semiconductor substrate.

5. The sensor according to claim 2, further comprising a buried layer of the second conductivity type below the charge accumulation region of the first conductivity type,
  wherein a region of the plurality of regions which is located at a deepest position is in contact with the buried layer.

6. The sensor according to claim 1, further comprising a buried layer of the second conductivity type below the charge accumulation region of the first conductivity type.

7. A camera comprising:
  a solid-state image sensor defined in claim 1; and
  a signal processing unit which processes a signal obtained by the solid-state image sensor.

* * * * *